United States Patent
Ramachandran et al.

(10) Patent No.: US 9,548,288 B1
(45) Date of Patent: Jan. 17, 2017

(54) INTEGRATED CIRCUIT DIE DECOUPLING SYSTEM WITH REDUCED INDUCTANCE

(71) Applicant: Apple Inc., Cupertino, CA (US)

(72) Inventors: Vidhya Ramachandran, Cupertino, CA (US); Chonghua Zhong, Cupertino, CA (US); Shawn Searles, Austin, TX (US); Jun Zhai, San Jose, CA (US); Young Doo Jeon, San Jose, CA (US); Huabo Chen, Saratoga, CA (US)

(73) Assignee: Apple Inc., Cupertino, CA (US)

(*) Notice: Subject to any disclaimer, the term of this patent is extended or adjusted under 35 U.S.C. 154(b) by 25 days.

(21) Appl. No.: 14/966,482

(22) Filed: Dec. 11, 2015

Related U.S. Application Data

(60) Provisional application No. 62/095,363, filed on Dec. 22, 2014.

(51) Int. Cl.
| | |
|---|---|
| *H01L 25/16* | (2006.01) |
| *H01L 23/528* | (2006.01) |
| *H01L 23/50* | (2006.01) |
| *H01L 21/78* | (2006.01) |
| *H01L 23/00* | (2006.01) |

(Continued)

(52) U.S. Cl.
CPC ............ *H01L 25/16* (2013.01); *H01L 21/768* (2013.01); *H01L 21/78* (2013.01); *H01L 23/50* (2013.01); *H01L 23/528* (2013.01); *H01L 24/11* (2013.01); *H01L 24/14* (2013.01); *H01L 24/94* (2013.01); *H01L 25/50* (2013.01); *H01L 2224/13014* (2013.01); *H01L 2224/13016* (2013.01); *H01L 2924/14* (2013.01); *H01L 2924/1427* (2013.01); *H01L 2924/19011* (2013.01); *H01L 2924/19041* (2013.01); *H01L 2924/19042* (2013.01); *H01L 2924/19102* (2013.01); *H01L 2924/30107* (2013.01)

(58) Field of Classification Search
CPC ........ H01L 25/16; H01L 23/528; H01L 23/50; H01L 24/14; H01L 21/768; H01L 24/11; H01L 21/78; H01L 24/94
USPC ............... 257/737, 738, 528, 532, 535, 774, 602,257/369, 690; 361/277, 760, 748, 761
See application file for complete search history.

(56) References Cited

U.S. PATENT DOCUMENTS

| | | | |
|---|---|---|---|
| 6,157,067 A * | 12/2000 | Hsu ......................... | H01L 29/94 257/368 |
| 6,191,479 B1 | 2/2001 | Herrell | |
| 6,828,666 B1 | 12/2004 | Herrell | |

(Continued)

*Primary Examiner* — Alexander Oscar Williams
(74) *Attorney, Agent, or Firm* — Meyertons, Hood, Kivlin, Kowert & Goetzel, P.C.

(57) ABSTRACT

A system that includes an integrated circuit die and a power supply decoupling unit is disclosed. The system includes an integrated circuit die, and interconnection region, and a decoupling unit. The integrated circuit die includes a plurality of circuits, which each include multiple devices interconnected using wires fabricated on a first plurality of conductive layers. The interconnection region includes multiple solder balls, and multiple conductive paths, each of which includes wires fabricated on a second plurality of conductive layers. At least one solder ball is connected to an Input/Output terminal of a first circuit of the plurality of circuits via one of the conductive paths. The decoupling unit may include a plurality of capacitors and a plurality of terminals. Each terminal of the decoupling unit may be coupled to a respective power terminal of a second circuit of the plurality of circuits via the conductive paths.

17 Claims, 12 Drawing Sheets

(51) Int. Cl.
*H01L 21/768* (2006.01)
*H01L 25/00* (2006.01)

(56) References Cited

U.S. PATENT DOCUMENTS

| | | | |
|---|---|---|---|
| 6,961,231 B1 | 11/2005 | Alexander | |
| 7,391,110 B2 | 6/2008 | Cornelius | |
| 7,919,860 B2 | 4/2011 | Murugan | |
| 8,208,338 B2 | 6/2012 | Kim | |
| 8,234,773 B2* | 8/2012 | Bedair | H05K 1/16 29/592.1 |
| 8,803,288 B1* | 8/2014 | Marino | H01G 7/00 257/602 |
| 9,101,068 B2* | 8/2015 | Yun | H05K 7/1092 |
| 9,257,834 B1* | 2/2016 | Moghe | H02H 7/205 |
| 2002/0089810 A1* | 7/2002 | Casper | H01L 28/60 361/306.3 |
| 2004/0080021 A1* | 4/2004 | Casper | H01L 21/4846 257/528 |
| 2004/0188811 A1* | 9/2004 | Vandentop | H01L 25/18 257/678 |
| 2005/0239415 A1* | 10/2005 | Sagae | H04B 1/48 455/78 |
| 2007/0018298 A1* | 1/2007 | Gamand | H01L 21/76898 257/686 |
| 2007/0058308 A1* | 3/2007 | Thijs | H03F 1/223 361/56 |
| 2008/0185614 A1* | 8/2008 | Gamand | H01L 23/49833 257/203 |
| 2008/0284037 A1* | 11/2008 | Andry | H01L 21/6835 257/774 |
| 2008/0285244 A1* | 11/2008 | Knickerbocker | G01R 1/0425 361/760 |
| 2009/0085217 A1* | 4/2009 | Knickerbocker | H01L 21/486 257/774 |
| 2009/0180236 A1* | 7/2009 | Lee | H01G 4/012 361/301.4 |
| 2009/0185327 A1* | 7/2009 | Seymour | H01G 9/0029 361/500 |
| 2009/0190236 A1* | 7/2009 | Do | G02B 9/12 359/716 |
| 2010/0059879 A1* | 3/2010 | Bielen | H01L 23/147 257/712 |
| 2010/0327433 A1* | 12/2010 | Sweeney | H01G 4/33 257/724 |
| 2011/0108948 A1* | 5/2011 | Kim | H01L 21/76898 257/532 |
| 2016/0218046 A1* | 7/2016 | Or-Bach | H03K 19/1774 |
| 2016/0268341 A1* | 9/2016 | Nazarian | H01L 27/2463 |

* cited by examiner

INTEGRATED CIRCUIT DIE DECOUPLING SYSTEM WITH REDUCED INDUCTANCE

PRIORITY CLAIM

The present application claims benefit of priority to provisional application No. 62/095,363 title "INTEGRATED CIRCUIT DIE DECOUPLING SYSTEM WITH REDUCED INDUCTANCE" and filed on Dec. 22, 2014 which is incorporated by reference in its entirety as though fully and completely set forth herein.

BACKGROUND

Technical Field

Embodiments described herein relate to integrated circuits, and more particularly, to techniques for decoupling power supplies.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality such as various PDA functionality and/or general application support, tablets, laptops, net tops, smart watches, wearable electronics, etc.

Such mobile devices may include multiple integrated circuits, each performing different tasks. In some cases, circuits that perform different tasks may be integrated into a single integrated forming a system on a chip (SoC). The different functional units within a SoC may operate at different power supply voltage levels. In some designs, power supply or regulator circuits may be included in the SoC to generate different voltage levels for the myriad functional units included in the SoC.

High frequency noise on the power supplies may be created by the power supply and regulation circuits and may affect the performance of the functional units within an integrated circuit. In some cases, one functional unit may create noise on a power supply that may affect the operation of other functional units. Power supplies coupled to circuits or functional units particularly affected by power supply noise may be filtered in order to mitigate the effects of the power supply noise.

SUMMARY OF THE EMBODIMENTS

Various embodiments of a system including an integrated circuit die and decoupling unit are disclosed. Broadly speaking, a system is contemplated in which a decoupling unit is coupled to integrated circuit die. The integrated circuit may include multiple circuits and an interconnection region. Each circuit may include multiple devices interconnected via a first plurality of wires fabricated on a first plurality of conductive layers. The interconnection region may include a plurality of conductive paths, and multiple solder balls. Each conductive path may include a second plurality of wires fabricated on a second plurality of conductive paths. At least on solder ball may be coupled to an Input/Output (I/O) terminal of a first circuit of the plurality of circuits via a given conductive paths. The at least one decoupling unit may include a plurality of capacitors and a plurality of terminals. Each terminal may be coupled to respective power terminals of a second circuit by respective one of a subset of the plurality of conductive paths.

In one embodiment, the at least one decoupling unit includes a plurality of capacitors. In another embodiment, each capacitor may be a trench capacitor, while, in another non-limiting embodiments, each capacitor may be a Metal Insulator Metal (MIM) capacitor.

In a further embodiment, a direction of current flow through a first capacitor may be in an opposite direction of a current flow through a second capacitor. In other embodiments, a first subset of the plurality of power terminals may be coupled to a positive power supply node within the second circuit, and a second subset of the plurality of power terminals may be coupled to a ground node included in the second circuit.

BRIEF DESCRIPTION OF THE DRAWINGS

The following detailed description makes reference to the accompanying drawings, which are now briefly described.

Figure 1:
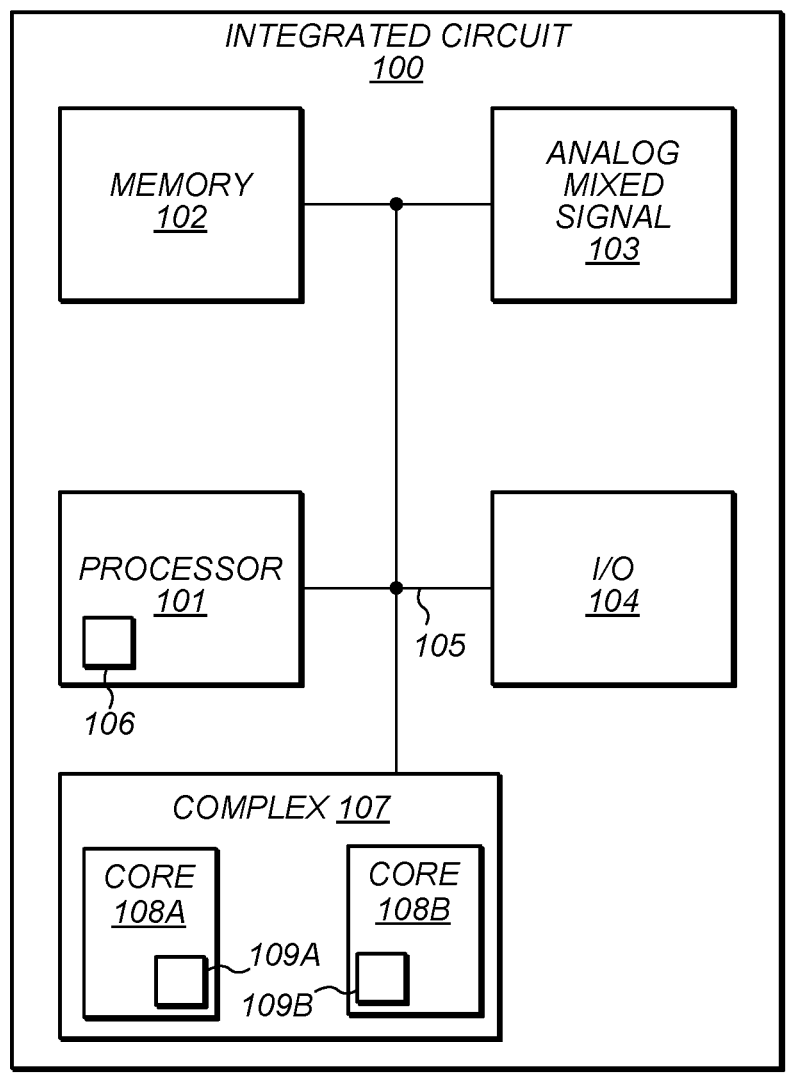
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

In a computing system, power supplies to individual functional units or circuits may include an undesirable high frequency component superimposed on a desired DC voltage level. Such high frequency components (or "noise") may be a by-product of on-chip voltage generation and/or regulation. Alternatively or additionally, noise may be generated by functional units or circuits themselves as logic gates included with the functional units or circuits charge and discharge load capacitances as their respective output logic states change.

Certain circuits may be particularly sensitive to power supply noise. For example, analog reference or bias generators may not function as desired in the presence of power supply noise. Amplifiers, such as those used to detect small signals generated during reading a data storage cell in a memory, may also be affected by such power supply noise. One method for compensative for power supply noise involves filtering the noise from a power supply node using a decoupling capacitor coupled between the power supply node and ground. Such a capacitor may provide a low impedance path for signals at a certain frequency between the power supply node and ground thereby preventing the high frequency signals from reaching power supply terminals of a particular functional unit or circuit of the computing system.

Parasitic circuit elements in a decoupling capacitor, such as, e.g., effective series resistance and effective series inductance, may lead to inefficiencies and energy loss with the Power Distribution Network (PDN) of the computing system. The embodiments illustrated in the drawings and described below may provide techniques minimizing effective series resistance and inductance of decoupling capacitors thereby maintaining desired performance levels.

System-on-a-Chip Overview

A block diagram of an integrated circuit including multiple functional units is illustrated in FIG. 1. In the illustrated embodiment, the integrated circuit 100 includes a processor 101, and a processor complex (or simply a "complex") 107 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more energy modeling units 106 which may be configured to estimate both dynamic and leakage power consumption on a cycle and execution thread basis. In other embodiments, any functional unit, such as, e.g., I/O block 104, may include an energy modeling unit.

Complex 107 includes processor cores 108A and 108B. Each of processor cores 108A and 108B may be representative of a general-purpose processor configured to execute software instructions in order to perform one or more computational operations. Processor cores 108A and 108B may be designed in accordance with one of various design styles. For example, processor cores 108A and 108B may be implemented as an ASIC, FPGA, or any other suitable processor design. Each of processor cores 108A and 108B may, in various embodiments, include energy modeling units 109A and 109B, respectively. Energy modeling units 109A and 109B may each monitor energy usage within their respective processor cores thereby allowing, in some embodiments, accounting of energy associated with a given process being executed across multiple processor cores.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks.

I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computer systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

In some embodiments, each of the aforementioned functional units may include multiple circuits, each of which may include multiple devices, such as, e.g., metal-oxide semiconductor field-effect transistors (MOSFETs) connected via multiple wires fabricated on multiple conductive layers. The conductive layers may be interspersed with insulating layers, such as, silicon dioxide, for example. Each circuit may also contain wiring, fabricated on the conductive layers, designated for a power supply net or a ground supply net.

Integrated circuit 100 may, in various embodiments, be fabricated on a silicon wafer (or simply "wafer") along with numerous identical copies of integrated circuit 100, each of which may be referred to as a "chip" or "die." During manufacture, various manufacturing steps may be performed on each chip in parallel. Once the manufacturing process has been completed, the individual chips may be removed from the wafer by cutting or slicing through unused areas between each chip.

Power Supply Decoupling

Figure 2:
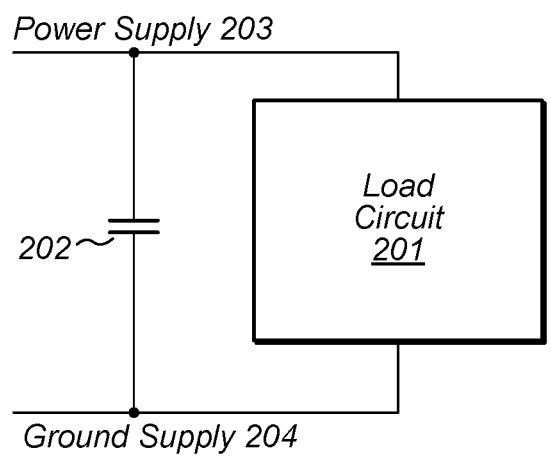
FIG. 2 illustrates an embodiment of a power supply decoupling system

Turning now to FIG. 2, an embodiment of a power supply decoupling system is illustrated. The illustrated embodiment includes load circuit 201 coupled between power supply 203 and ground supply 204. In some embodiments, load circuit may correspond to a particular functional unit of an integrated circuit, such as, analog/mixed signal block 103 of integrated circuit 100 as illustrated in FIG. 1, or may correspond to a specific circuit included within a particular functional unit. Decoupling capacitor 202 is also coupled between power supply 203 and ground supply 204. Although only a single decoupling capacitor is depicted in FIG. 2, it is noted that, in various embodiments, any suitable number of decoupling capacitors may be employed. It is further noted that although only a single connection for each of power supply 203 and ground supply 204 are depicted in FIG. 2, in other embodiments, multiple terminals for each of power supply 203 and ground supply 204 may be employed. Each terminal may be connected to a particular location on wiring for a corresponding supply, either power or ground, node within load circuit 201.

In various embodiments, a power supply circuit (not shown) may be coupled between power supply 203 and ground supply 204. The power supply circuit may be configured to generate a particular DC voltage level on power supply 203 to allow operation of load circuit 201. In some embodiments, the power supply circuit may include a voltage regulator circuit or other suitable circuit configured to generate the desired particular voltage level. During operation, the DC voltage level generated by the power supply circuit may have small excursions (commonly referred to as "supply noise") from an ideal value. Such excursions may be detrimental to the operation of load circuit 201.

The voltage level of power supply 203 may also vary due to instantaneous power demands from individual circuits within load circuit 201. As such individual circuits activate or deactivate, or, in the case of logic circuits, transition from one logic state to another, current drawn from the power supply circuit through power supply 203 may be in excess of a level of current instantaneously available from the power supply circuit. In such case, the voltage level on power supply 203 may momentarily drop. Such a drop may, in some embodiments, induce additional voltage changes on power supply 203 due to resonant effects with parasitic inductances and other reactive elements coupled to power supply 203. Variation in a power supply voltage level due to the circuit transitions is commonly referred to as "switching noise" and, as with supply noise, be detrimental to the operation of load circuit 201.

To mitigate the effects of power supply and switching noise, a decoupling capacitor, such as, e.g., decoupling capacitor 202 may be employed. A value of decoupling capacitor 202 may be selected to filter a range of frequencies of noise that may be present on power supply 203 due to the effects described above. At the target frequencies, decoupling capacitor 202 may provide a low impedance path to ground supply 204 for noise on power supply 203 thereby shunting the undesired voltage excursions to ground supply 204. By filtering power supply 203, in such a fashion, performance of load circuit 201 may be maintained at desired levels.

Decoupling capacitor 202 may, in various embodiments, be an Integrated Passive Device (IPD) mounted on a package where the integrated circuit is mounted. In some embodiments, decoupling capacitor 202 may be mounted on an opposite side of the package as the integrated circuit. Decoupling capacitor 202 may be aligned with the functional unit or target circuit whose power supply is to be filtered.

In some embodiments, decoupling capacitor may include multiple capacitors, each of which may be coupled between respective pairs of terminals. In such cases, decoupling capacitor 202 may be referred to as a "multi-terminal capacitor." As described below in more detail, by employing multiple terminals, a large current loop may be separated into multiple smaller currents loops thereby reducing the effective inductance of the interconnection between decoupling capacitor 202 and load circuit 201. By reducing the effective inductance of the interconnection between decoupling capacitor 202 and load circuit 201, the performance of decoupling capacitor 202 may be improved in various embodiments.

Although a single device, i.e., decoupling capacitor 202, is depicted in FIG. 2, it is noted that, in other embodiments, other suitable circuit elements, such as, e.g., inductors and resistors, may be employed in conjunction with decoupling capacitor 202 to provide a desired level of filtering on power supply 203.

Parasitic Effects Associated with Capacitors

Figure 3:
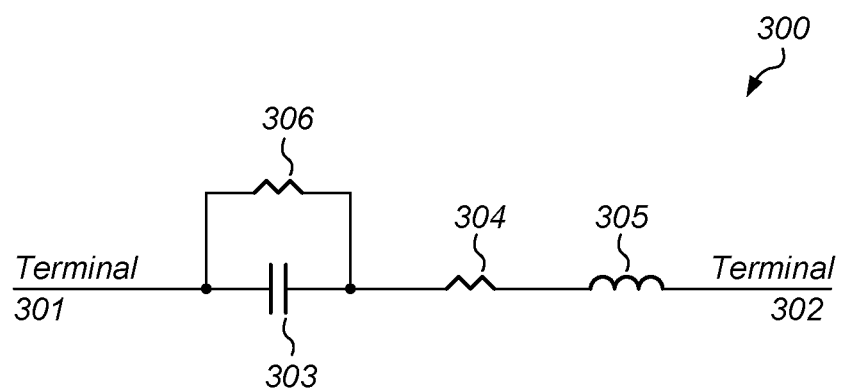
FIG. 3 illustrates an embodiment of a model of a decoupling capacitor.

Capacitors used for decoupling may be constructed according to various design styles. The design style of a particular decoupling capacitor, such as, e.g., decoupling capacitor 202 as illustrated in FIG. 2, may influence the electrical characteristics of the decoupling capacitor, causing the decoupling capacitor to exhibit electrical characteristics beyond that of an ideal capacitor. To better understand and simulate the effects of the full range of electrical characteristics of a decoupling capacitor, a circuit model may be employed. An embodiment of a model of a decoupling capacitor is illustrated in FIG. 3.

In the illustrated embodiment, capacitor model 300 includes ideal capacitor 303, effective series resistance (commonly referred to as "ESR") 304, effective series inductance (commonly referred to as "ESL") 305 and shunt resistance 306. Ideal capacitor 303, effect series resistance 304, and effective series inductance 305 are coupled in series between terminals 301 and 302. Shunt resistance 306 is coupled across ideal capacitor 303.

Ideal capacitor 303 may represent an intended value for the capacitor. The other elements in capacitor model 300 may represent parasitic elements that may be present in an actual physical implementation of a capacitor. By adjusting certain physical parameters of a capacitor's design, values of the parasitic circuit elements associated with the capacitor may be adjusted to allow operation of the capacitor at predetermined frequencies, voltage levels, and the like.

An actual physical capacitor may dissipate energy as current flows into and out of the capacitor. Effective series resistance 304 may model such energy losses. In various embodiments, effective series resistance 304 may represent the resistance associated with leads, conductive balls, and the like, used to couple the capacitor to a target circuit. Alternatively or additionally, effective series resistance 304 may represent energy losses within dielectric materials included in the capacitor to separate conductive plates.

Effective series inductance 305 may, in various embodiments, represent the inductance associated with connections to and from the capacitor. Such connections may include leads, conductive balls, circuit board traces, and the like. In some embodiments, the value of the effective series inductance of a capacitor may scale with the area of a current loop through a load circuit, and the capacitor with its associated interconnect to the load circuit. The ESL of a capacitor may limit a speed at which a decoupling capacitor may be able to shunt unwanted energy from a power supply to a ground supply. Moreover, effective series inductance 305 may form a resonant circuit with ideal capacitor 303. The frequency at which such a resonant circuit resonates may be depend on both the values of ideal capacitor 303 and effective series inductance 305.

In addition to energy losses in the dielectric materials used in a physical capacitor implementation, the dielectric materials may also allow a small amount of current (commonly referred to as "leakage current") to flow from one terminal of the capacitor to another. Such a leakage current may be modeled using shunt resistance 306.

It is noted that the embodiment of the capacitor model illustrated in FIG. 3 is merely an example. In other embodiments, different circuit elements, and different configurations of circuit elements may be employed, and depending on an intended application for a capacitor, different materials, different physical arrangement of terminals and conductive plates, may be selected to achieve desired values for the aforementioned parasitic circuit elements within the capacitor.

Figure 4:
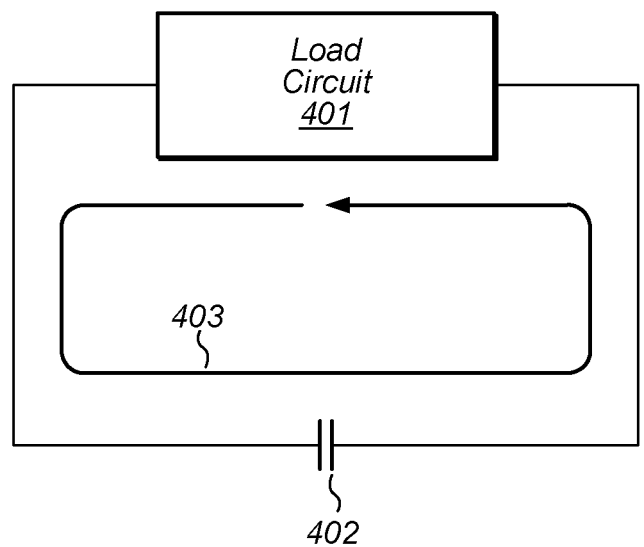
FIG. 4 depicts a current loop through an embodiment of a decoupling capacitor.

Turning to FIG. 4, a current loop through an embodiment of a decoupling capacitor is illustrated. The illustrated embodiment includes load circuit 401 coupled to decoupling capacitor 402. In various embodiments, load circuit 401 and decoupling capacitor 402 may correspond to load circuit 201 and decoupling capacitor 202 as illustrated in FIG. 2.

As described above, a portion of the ESL of capacitor 402 may depend on interconnect between decoupling capacitor 402 and load circuit 401. Current loop 403 depicts a path that current may flow between decoupling capacitor 402 and load circuit 401. In general, the larger the current loop, the larger the inductance. The amount of inductance of the interconnection between decoupling capacitor 402 and load circuit 401 may correspond to time-varying magnetic flux density within the area of the loop formed by the interconnection. In some embodiment, be reducing the area of the loop, the ESL of the interconnect coupling decoupling capacitor 402 to load circuit 401 may be reduced thereby improving a response of the decoupling capacitor to high frequencies.

In some embodiments, placing decoupling capacitor 402 in close proximity to load circuit 401 may reduce the area of current loop 403. Since the current loop flows through decoupling capacitor 402, the physical size of decoupling capacitor 402 may, in various embodiments, also be reduced in order to decrease the area of current loop 403. A size of a package for an integrated circuit that includes load circuit 401, such as, e.g., integrated circuit 100 as illustrated in FIG. 1, may, in various embodiments, be adjusted to in order to reduce the size of current loop 403.

It is noted that the embodiment illustrated in FIG. 4 is merely an example. In other embodiments, different numbers of decoupling capacitors and different connections to load circuit 401 are possible and contemplated.

Figure 5:
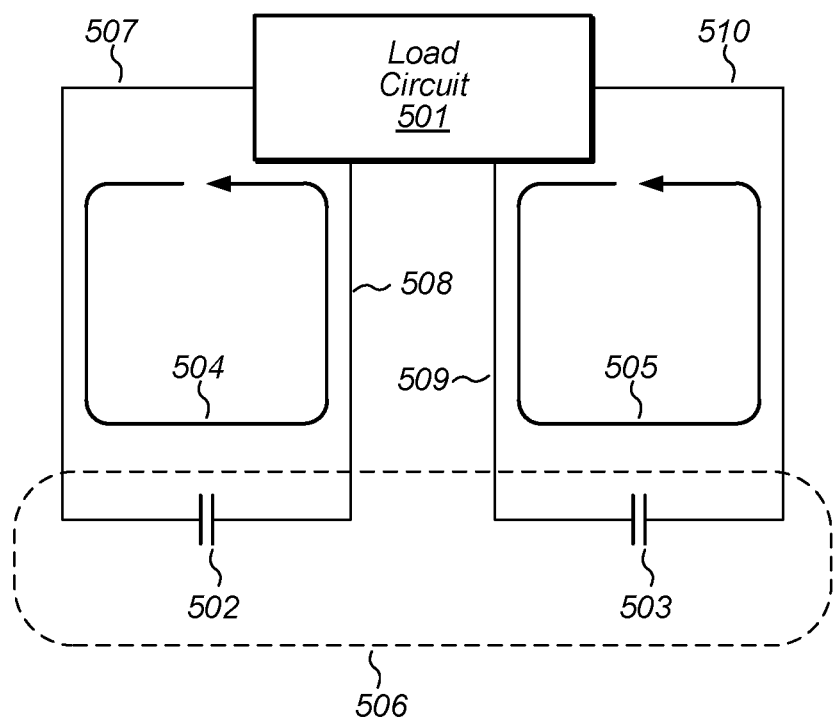
FIG. 5 depicts multiple current loops through another embodiment of a decoupling capacitor.

Moving to FIG. 5, another embodiment of a decoupling capacitor employing multiple current loops is depicted. In the illustrated embodiment, load circuit 501 is coupled to decoupling unit 506, which includes capacitors 502 and 503. In various embodiments, load circuit 501 may correspond to load circuit 201 of FIG. 2, and decoupling unit 506 may correspond to decoupling capacitor 202 of FIG. 2.

Capacitor 502 is coupled to load circuit 501 by nodes 507 and 508. In a similar fashion, capacitor 503 is coupled to load circuit 501 by nodes 509 and 510. Nodes 507 and 510 may, in some embodiments, correspond to power supply 203 of FIG. 2. In other embodiments, nodes 508 and 509 may correspond to ground supply 204 as illustrated in FIG. 2.

Decoupling unit 506 may, in various embodiments, be an IPD including capacitors 502 and 503. Each of capacitors 502 and 503 may be trench capacitors, Metal Insulator Metal (MIM) capacitors, or any other capacitor type suitable for decoupling purposes may be used. In some embodiments, capacitors 502 and 503 may be manufactured as a single physical capacitor with multiple terminals to connect to nodes 507 through 510. Although decoupling unit 506 is depicted as including two capacitors, it is noted that, in other embodiments, any suitable number of capacitors may employed.

Current loop 504 corresponds to a path current may travel from load circuit 501 through capacitor 502 and back to load circuit 501. In a similar fashion, current loop 505 corresponds to a current path from load circuit 501 through capacitor 503. By employing two current loops, each loop encloses less area and, therefore, less time-varying magnetic flux, than current loop 403 as illustrated in FIG. 4. With smaller current loops, a frequency response of each of capacitors 502 and 503 may be improved as a result of smaller ESL values.

A direction of current flow in current loop 505 may, in some embodiments, be in a direction opposite to current flow in current loop 504. By arranging the connections between load circuit 501 and decoupling unit 506 to allow for the current flow in each of current loops 504 and 505 to be in opposing directions, effective inductances resulting from the current flows in each loop may not combine in an additive fashion. In some embodiments, as more loops are added, connections to each new loop may be arranged so as to allow for a direction of current flow in a given current loop to be in an opposing direction to the two adjacent current loops.

It is noted that the embodiment illustrated in FIG. 5 is merely an example. In other embodiments, different number of current loops may be employed.

Figure 6:
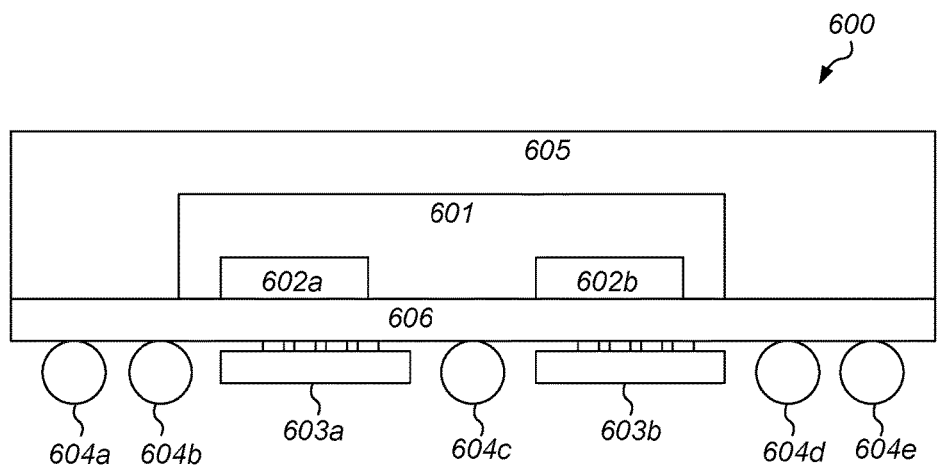
FIG. 6 illustrates an embodiment of a system including multiple decoupling units.

An embodiment of a system employing a decoupling unit is illustrated in FIG. 6. In the illustrated embodiment, system 600 includes integrated circuit 601, which includes functional units 602a and 602b, coupled to interconnection region 606. In various embodiments, either of functional units 602a and 602b may correspond to load circuit 201 as illustrated in FIG. 2. Interconnection region 606 is further coupled to solder balls 604a through 604e, and decoupling units 603a and 603b. In some embodiments, each of decoupling units 603a and 603b may correspond to decoupling capacitor 202 as depicted in the embodiment illustrated in FIG. 2.

As described below in more detail, interconnection region 606 may include multiple conductive paths for coupling power supply and ground supply nets of functional units 602a and 602b to decoupling units 603a and 603b, respectively. In various embodiments, interconnection region 606 may be fabricated directly on integrated circuit 601 while still in wafer form, i.e., prior to removal of integrated circuit from a wafer of silicon on which it was manufactured or while still in reconstituted wafer form, i.e., after deposition of redistribution layers which fan-out the silicon integrated circuit die into a fan-out wafer level package. The arrangement of conductive paths within interconnection region 606 may be determined to minimize parasitic inductive and resistive effects of the conductive paths used to couple functional units 602a and 602b to their respective decoupling units. The positioning of decoupling units 603a and 603b may also be determined in order to minimize the aforementioned parasitic effects.

Decoupling units 603a and 603b each may include multiple terminals coupled to respective conductive paths through interconnection region 606. In some embodiments, decoupling units 603a and 603b may be an IPD, and may include multiple capacitors, inductors, or other suitable devices that may be employed to filter power supplies coupled to integrated circuit 601. Individual capacitors included in decoupling units 603a and 603b may be coupled between pairs of terminals. In various embodiments, a portion of terminals 605 may be designated for coupling to a power supply, while another portion of terminals 605 may be designed for coupled to a ground supply. Terminals may be designated to be coupled to either a power supply or ground supply in order to allow a direction of current flow in adjacent current loops to flow in opposing directions as depicted in FIG. 5.

In some embodiments, interconnection region 606 may be larger than integrated circuit 601 to allow for a larger spacing between solder balls 604a through 604e. Additionally or alternatively, the combination of integrated circuit 601 and interconnection region 606 may be encapsulated in mold compound 605. In various embodiments, mold compound 605 may be an epoxy or other suitable material and may be of different thicknesses on the sides of integrated circuit 601 than on the backside of integrated circuit 601.

It is noted that the embodiment illustrated in FIG. 6 is merely an example. In other embodiments, different numbers of integrated circuit, different numbers of decoupling units, and different numbers of conductive paths may be employed.

Figure 7:
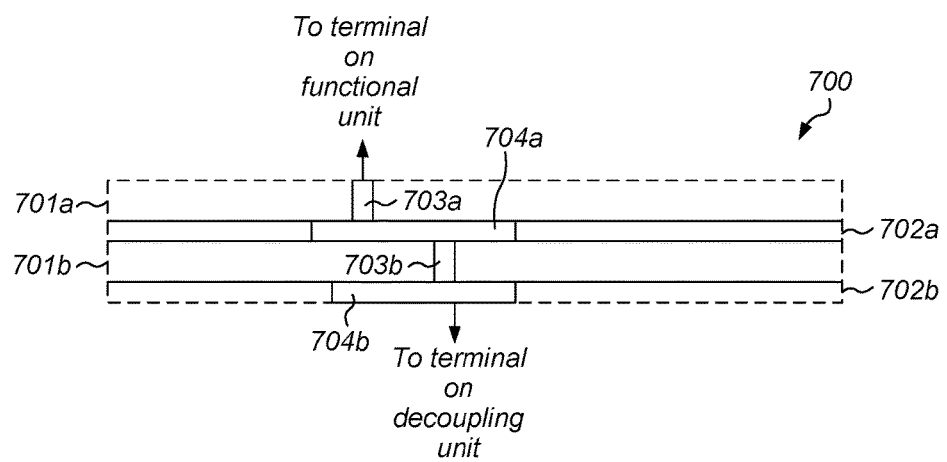
FIG. 7 illustrates an embodiment of an interconnection region.

Turning to FIG. 7, a cross section of an embodiment of an interconnection region is depicted. In some embodiments, interconnection region 700 may correspond to interconnection region 606 as illustrated in FIG. 6. In the illustrated embodiment, interconnection region 700 includes wiring layers 702a and 702b, and insulating layers 701a and 701b.

On each of wiring layers 702a and 702b, multiple wires may be formed. For example, in the illustrated embodiment, wiring layer 702a includes wire 704a, and wiring layer 702b includes wire 704b. During manufacture, a layer of metal, such as, e.g., aluminum or copper, may be deposited. Once the layer of metal has been deposited, it may be patterned and etched to form the desired wires such as wires 704a and 704b, for example. The metal may, in other embodiments, be deposited in patterned cavities without a subsequent patterning process. In various embodiments, the wires may be designed to allow for interconnection between terminals on a functional unit of an integrated circuit, and terminals on a decoupling unit. In some cases, additional wires may be generated to allow for the connection of terminals of an integrated circuit to solder balls that will be affixed to interconnection region 700. Although only a single wire is depicted on each of wiring layers 702a and 702b, in other embodiments, any suitable number of wires may be employed.

In various embodiments, insulating layers 701a and 701b may be silicon oxide or any other material suitable for insulating between metallization of wiring layers 702a and 702b. The insulating layers 701a and 701b may, in various embodiments, be deposited as part of the manufacturing process that produces interconnection region 700.

To form complete conductive paths through interconnection region, vias, such as, e.g., vias 703a and 703b, may be employed to allow connections through an insulating layer to connect to wires on different wiring layers. In some embodiments, holes may be etched in the material of a given insulating layer, and then metal deposited into the hole. Although only a single via is depicted through each of insulating layers 701a and 701b, in other embodiments, any suitable number of vias may be employed.

Conductive paths through interconnection region 700 may be made with a combination of wires and vias. For example, in the illustrated embodiment, a conductive path from a terminal on a functional unit and a terminal of a decoupling unit is formed by via 703a, wire 704a, via 703b, and wire 704b. Although only a single conductive path is depicted in the illustrated embodiment, in other embodiments, any suitable number of conductive paths may be employed. The placement of vias and the arrangement of wires to form conductive paths may be dependent on the relative positions of functional units within an integrated circuit and corresponding decoupling units. In some cases, a particular shape of a conductive path may be chosen to minimize an effective inductance and an effective resistance of the conductive path.

It is noted that the embodiment illustrated in FIG. 7 is merely an example. In other embodiments, different numbers of wiring layers and insulating layers may be employed.

Figure 8A:
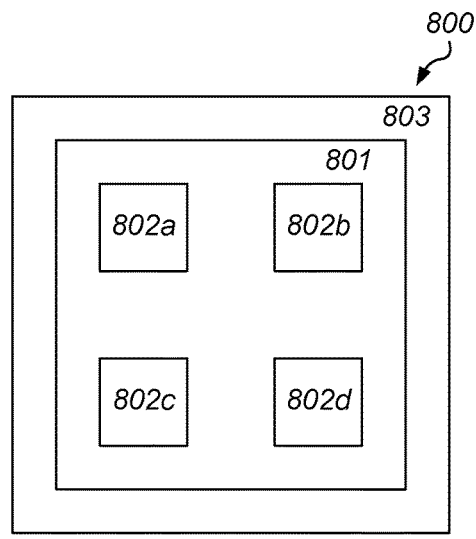
FIG. 8A illustrates a top view of an embodiment of a system including multiple decoupling units.

A top view of an embodiment of a system including decoupling units is illustrated in FIG. 8A. In the illustrated embodiment, system 800 includes integrated circuit 801 and interconnection region 803. In various embodiments, system 800 may correspond with system 600 as illustrated in FIG. 6 with integrated circuit 801 corresponding to integrated circuit 601 and interconnection region 803 corresponding to interconnection region 606.

Integrated circuit 801 includes multiple functional units denoted 802a through 802d. As described above in regard to FIG. 1, each of functional units 802a through 802d may be designed to perform certain tasks, such as clock generation, input/output functions, and the like. In some embodiments, one or more of the functional units may benefit from power supply filtering. In such cases, decoupling units may be mounted on the underside of interconnection region 803 as shown below in FIG. 8B.

As described above in regard to FIG. 7, interconnection region 803 may include multiple wiring and insulator layers. In some embodiments, interconnection region 803 may be larger than integrated circuit 801 (commonly referred to as a "fan out" configuration) to allow for a larger pitch between solder balls on the underside of interconnection region 803. Mold compound or other suitable encapsulating material may, in some embodiments, be added to cover the system one the fabrication of interconnection region 803 has been completed.

It is noted that the embodiment illustrated in FIG. 8A is merely an example. In other embodiments, different numbers of functional units within integrated circuit 801 are possible and contemplated.

Figure 8B:
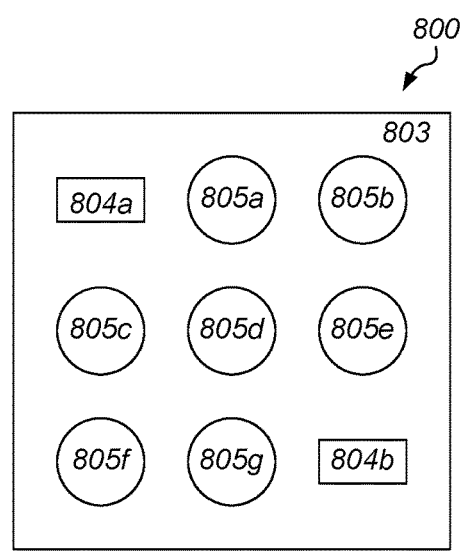
FIG. 8B illustrates a bottom view of an embodiment of a system including multiple decoupling units.

A bottom view of the system 800 is illustrated in FIG. 8B. In the illustrated embodiment, solder balls 805a through 805g are mounted on interconnection region 803. Additionally, decoupling units 804a and 804b may, in various embodiments, be mounted to interconnection region 803.

Solder balls 805a through 805g may be fabricated on the underside of interconnection region 803 to allow for system 800 to be soldered to a circuit board or other suitable substrate. In various embodiments, solder balls 805a through 805g may be placed at regular intervals. Solder balls may be omitted, in some positions, to allow for the placement of decoupling units or other suitable passive devices. In other cases, passive devices, such as, e.g., decoupling units 804a and 804b, may be placed between solder balls, space permitting.

Decoupling units 804a and 804b may, in some embodiments, correspond to decoupling units 603a and 603b as illustrated in FIG. 6. In various embodiments, decoupling units 804a and 804b may be positioned on the underside of interconnection region 803 in order to minimize lengths of conductive paths between the decoupling units and corresponding functional units to whose internal power supplies the decoupling units are coupled. For example, decoupling unit 804a may be positioned "underneath" functional unit 802a to reduce the effective inductance of connections between decoupling unit 804a and functional unit 802a. It is noted that, in some cases, it may not be practical to place decoupling units directly in line with their corresponding functional units, and that any suitable position that achieves a desired level of effective inductance of the connections between a given decoupling unit and its corresponding functional unit may be employed.

It is noted that the embodiment illustrated in FIG. 8B is merely an example. In other embodiments, different numbers of solder balls and decoupling units may be employed.

Figure 9:
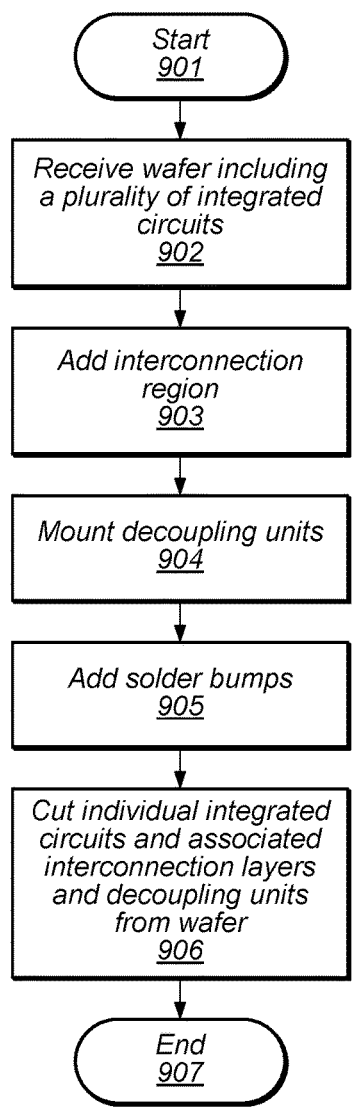
FIG. 9 depicts a flow diagram illustrating an embodiment of a method for manufacturing a system including an integrated circuit and a decoupling unit.

Turning to FIG. 9, a flow diagram depicting an embodiment of a method for manufacturing a system including multiple decoupling units is illustrated. The method begins in block 901. A wafer including multiple integrated circuits may then be received (block 902). The integrated circuits may be manufactured according to one of various semiconductor design processes. Each integrated circuit may include multiple functional units and circuits, each of which may include multiple power terminals. In some embodiments, a first portion of the multiple power terminals may be coupled to wiring for a local power supply for a particular functional unit, and a second portion of the multiple power terminals may be coupled to wiring for a local ground supply for the particular functional unit.

An interconnection region may then be added to one or more of the integrated circuits included in the wafer (block 903). As described above in regard to FIG. 7, the interconnection region may include multiple wiring layers separated by insulating layers. During the process of adding the interconnection region, conductive paths may be formed through the interconnection region by the deposition and etching of metal in the wiring layers. In some embodiments, via connections may be made through one or more of the insulating layers to allow wires on different wiring layers to be connected. In some embodiments, the addition of the interconnection region may be performed in accordance with a wafer level package manufacturing process. In some embodiments, a path of a given conductive path through the interconnection region may be selected based upon a desired position for a particular decoupling unit.

Once the interconnection region has been added, one or more decoupling units, such as, e.g., decoupling units 603a and 603b of FIG. 6, may be mounted atop the interconnection region (block 904). In various embodiments, the decoupling units may be positioned within a predetermined distance from a particular functional unit within the integrated circuit. The distance may, in some embodiments, be selected to reduce or minimize the length of conductive paths in the interconnection region thereby reducing the effective inductance see at the terminals of the decoupling unit. Multiple terminals included in the decoupling units may be connected to respective conductive paths in the interconnection region that are also connected to the power and ground terminals of the particular functional unit.

With the completion of the mounting of the decoupling units, solder balls or a ball-grid array (BGA) may then be added (block 905). In various embodiments, the solder balls may be deposited into predetermined locations corresponding to termination points of conductive paths included in the interconnection region. Such conductive paths may be connected to input/output (I/O), power supply, ground, and other suitable terminals of the integrated circuit. The solder balls may, in some embodiments, allow for soldering the system to a circuit board or other suitable substrate.

Upon completion of the addition of the solder balls, individual integrated circuits and any associated interconnection regions may be separated from the wafer (block 906). In some embodiments, an unused area between the various integrated circuits (commonly referred to as a "scribe lane" or "saw street") may be cut to allow the separation of the individual integrated circuits without damaging any of the circuitry associated with the integrated circuits. Once the individual integrated circuits have been separated, they may be ready for mounting on a circuit board or other suitable substrate. The method may then conclude in block 907.

Although the operations of the embodiment of the method illustrated in FIG. 9 are depicted as being performed in series, in other embodiments, one or more of the operations may be performed in parallel on in a different order.

Power Terminal Clustering

Figure 10:
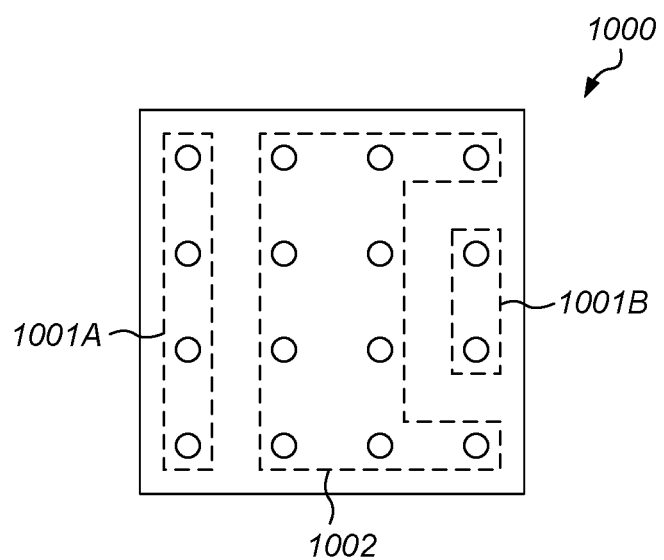
FIG. 10 illustrates an embodiment of an integrated circuit with clustered power terminals.

In some cases, the placement of functional units within an integrated circuit results in power and ground terminals for a particular functional unit being placed in close proximity to each other (commonly referred to as being "clustered"). An embodiment of an integrated circuit with clustered power terminals is illustrated in FIG. 10. In the illustrated embodiment, integrated circuit 1000 includes power terminals 1001A, 1001B, and 1002.

In some embodiments, power terminals 1001A and 1001B may be connected to a first functional unit (not shown) within integrated circuit 1000. For example, power terminals 1001A and 1001B may be coupled to power supply and ground nodes within a SRAM included in integrated circuit 1000. Each of power terminals 1001A and 1001B may include terminals for a positive power supply as well as a ground supply.

Power terminals 1002 may be coupled to a second function unit (not shown) within integrated circuit 1000. For example, power terminals 1002 may be coupled to power supply and ground nodes for a processor or processor core included in integrated circuit 1000. As above, power terminals 1002 may include terminals for a positive power supply as well as ground supply.

The embodiment illustrated in FIG. 10 is merely an example. In other embodiments, different arrangements of cluster power terminals are possible and contemplated.

Figure 11:
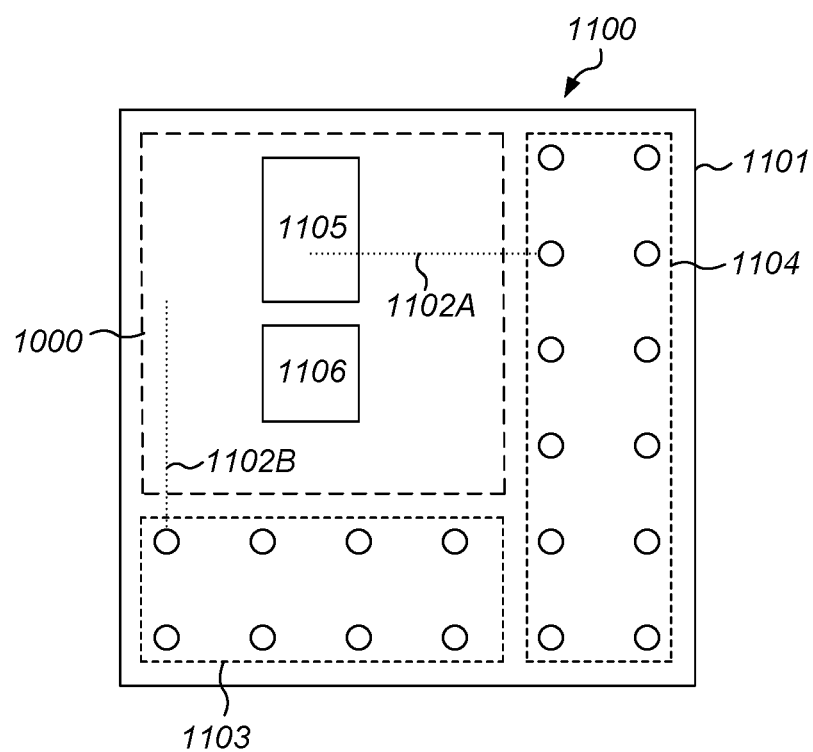
FIG. 11 illustrates a bottom view of an embodiment of a system including an integrated circuit with clustered power terminals.

Turning to FIG. 11, a bottom view of a system including integrated circuit 1000 is illustrated. In the illustrated embodiment, system 1100 includes integrated circuit 1000 (its position indicated by dashed line) and interconnection region 1101. In various embodiments, system 800 may correspond with system 600 as illustrated in FIG. 6 with integrated circuit 1000 corresponding to integrated circuit 601 and interconnection region 1101 corresponding to interconnection region 606. Affixed to interconnection region 1101 are solder bumps 1103 and 1104. It is noted that eight solder bumps are depicted in solder bumps 1103 and twelve solder bumps are depicted in solder bumps 1104, in other embodiments, each of solder bumps 1103 and 1104 may employ any suitable number of solder bumps.

Placed below integrated circuit 1000 are decoupling units 1105 and 1106. In various embodiments, decoupling units may correspond to decoupling capacitor 202 as depicted in the embodiment illustrated in FIG. 2. Decoupling units 1105 and 1106 may be oriented to minimize a distance to the power terminals of the first functional unit included in integrated circuit 1000 (see FIG. 10). Since the power terminals for the second functional unit of integrated circuit 1000 are clustered in two areas, decoupling units 1105 and 1106 may be placed in regions that still provide access to the power terminals associated with the second functional unit.

In some cases, however, dependent upon the number and size of decoupling units employed, some of the power terminals associated with the second functional unit may be blocked. To still maintain adequate connections to the power terminal associated with the second functional unit of integrated circuit 1000, wire 1102B may be fabricated in interconnection region 1101. Wire 1102B may be coupled between a power terminal associated with the second functional unit of integrated circuit 1000 and one of solder bumps 1103. Although a single wire is depicted in the present embodiment, in other embodiments, any suitable number of wires may be used between the power terminals associated with the second functional unit of integrated circuit 1000 and solder bumps included in solder bumps 1103. It is also noted that for reasons of clarity, other regions of solder bumps have been omitted from diagram illustrated in FIG. 11.

In order to maintain desired impedance characteristics between the power terminals associated with the first functional unit of integrated circuit 1000, wire 1102A may be coupled between a power terminal associated with the first functional unit and a solder bump included in solder bumps 1104. As with wire 1102B, wire 1102A may be fabricated as part of interconnection region 1101 during a semiconductor manufacturing process. It is noted that although only a single wire is shown coupling to a solder bump of solder bumps 1104, in various embodiments, any suitable number of wires may be employed.

In some embodiments, wire 1102B may be employ a thick wiring layer in interconnection region 1101 in order to reduce resistance and inductance. Additionally, wire 1102A may also be fabricated on a thick wiring layer, different from the wiring layer used for wire 1102B, also allowing for reduced inductance and resistance. In other embodiments, large regions (commonly referred to as "planes") may be used within interconnection region 1101 to connect like power terminals together and further reduce the impedance between a given solder bump and a give power terminal of integrated circuit 1000.

The embodiment illustrated in FIG. 11 is merely an example. In other embodiments, different numbers of solder bumps, integrated circuits, and decoupling units, and arrangements of wiring within interconnection region 1101 may be employed.

Figure 12:
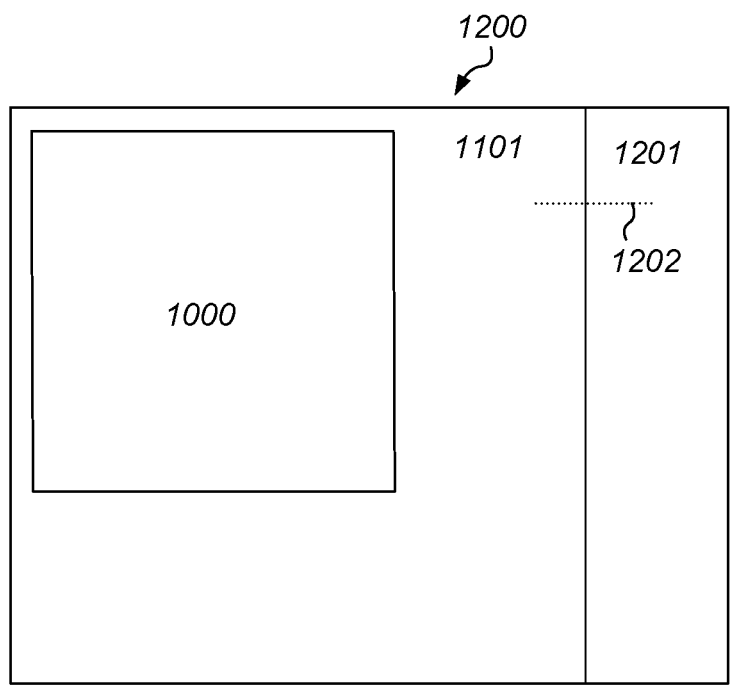
FIG. 12 illustrates an embodiment of a system including multiple integrated circuits.

Some systems may employ different integrated circuits that have different manufacturing and/or assembly requirements. For example, a voltage regulator circuit, or other suitable power management unit, may require passive devices, such as, e.g., inductors, which may not be able to be produced using the same semiconductor manufacturing process used to fabricate a processor or memory. In such cases, the different integrated circuits may be fabricated using separate manufacturing processes on different physical chips, the different integrated circuits may then placed adjacent to each other within a single semiconductor package or on a common circuit board of substrate. An embodiment of a system that includes multiple integrated circuits is illustrated in FIG. 12. In the illustrated embodiment, system 1200 includes integrated circuit 1000, interconnection region 1101, and integrated circuit 1201.

In the illustrated embodiment, system 1200 includes integrated circuit 1000, interconnection region 1101, and integrated circuit 1201. In various embodiments, each of integrated circuit 1000, interconnection region 1101, and integrated circuit 1201 may be mounted in a single semiconductor package. Alternatively, each of the aforementioned components may be mounted on a common circuit board or other suitable substrate material.

Such a circuit board or semiconductor package may include wires 1203 to couple integrated circuit 1201 to interconnection region 1101. In some embodiments, wiring traces in the semiconductor package may couple a solder bump on integrated circuit 1201 to a solder bump on interconnection region 1101.

In some embodiments, the semiconductor manufacturing process used to manufacture interconnection region 1101 may support the fabrication of devices such as transistors. In such cases, interconnection region 1101 and integrated circuit 1201 may be fabricated together on a single silicon substrate. Integrated circuit 1000 may then be attached at a desired location on interconnection region 1101 to complete the assembly of system 1200.

It is noted that the system illustrated in FIG. 12 is merely an example. In other embodiments, different numbers of integrated circuit, interconnection regions, and circuit modules may be employed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
an integrated circuit die including:
a plurality of circuits, wherein each circuit of the plurality of circuits includes a plurality of devices interconnected by a first plurality of wires fabricated on a first plurality of conductive layers; and
wherein a first circuit of the plurality of circuits includes and an Input/Output (I/O) terminal; and
wherein a second circuit of the plurality of circuits includes a plurality of power terminals;
an interconnection region including:
a plurality of conductive paths, wherein each conductive path of the plurality of conductive paths includes a second plurality of wires fabricated on a second plurality of conductive layers;
a plurality of solder balls, wherein at least one solder ball of the plurality of solder balls is coupled to the I/O terminal of the first circuit by a first conductive path of the plurality of conductive paths;
at least one decoupling unit including a plurality of capacitors and a plurality of terminals, wherein each terminal of the plurality of terminals is coupled to a respective one the plurality of power terminals of the second circuit via a respective one of a subset of the plurality of conductive paths.

2. The system of claim 1, wherein each capacitor of the plurality of capacitors comprises a trench capacitor.

3. The system of claim 1, wherein each capacitor of the plurality of capacitors comprises a Metal Insulator Metal (MIM) capacitor.

4. The system of claim 1, wherein a direction of current flow through a first capacitor of the plurality of capacitors is opposite of a direction of current flow through a second capacitor of the plurality of capacitors.

5. The system of claim 1, wherein each terminal of a first subset of the plurality of power terminals is coupled to a positive power supply node included in the second circuit, and wherein each terminal of a second subset of the plurality of power terminals is coupled to a ground node included in the second circuit.

6. The system of claim 1, wherein the at least one decoupling unit further includes an inductor.

7. The system of claim 1, wherein the at least one decoupling unit includes at least one resistor.

8. The system of claim 7, wherein the at least one resistor is coupled in series with at least one capacitor of the plurality of capacitors.

9. The system of claim 7, wherein the at least one resistor is coupled in parallel with at least one capacitor of the plurality of capacitors.

10. A system, comprising:
a processor;
a memory interconnect to the processor by a first plurality of wires fabricated on a first plurality of conductive layers, wherein the memory includes a plurality of power terminals;
an interconnection region including a plurality of conductive paths, wherein each conductive path of the plurality of conductive paths includes a second plurality of wires fabricated on a second plurality of conductive layers; and
at least one decoupling unit including a plurality of capacitors and a plurality of terminals, wherein each terminal of the plurality of terminals is coupled to a respective one the plurality of power terminals of the memory via a respective one of a subset of the plurality of conductive paths.

11. The system of claim 10, wherein at least one capacitor of the plurality of capacitors comprises a trench capacitor.

12. The system of claim 10, wherein at least one capacitor of the plurality of capacitors comprises a Metal Insulator Metal (MIM) capacitor.

13. The system of claim 10, wherein a direction of current flow through a first capacitor of the plurality of capacitors is opposite of a direction of current flow through a second capacitor of the plurality of capacitors.

14. The system of claim 10, wherein each terminal of a first subset of the plurality of power terminals is coupled to a positive power supply node included in the memory, and wherein each terminal of a second subset of the plurality of power terminals is coupled to a ground node included in the memory.

15. The system of claim 10, wherein the at least one decoupling unit includes at least one resistor.

16. The system of claim 15, wherein the at least one resistor is coupled in series with at least one capacitor of the plurality of capacitors.

17. The system of claim 15, wherein the at least one resistor is coupled in parallel with at least one capacitor of the plurality of capacitors.

* * * * *